United States Patent
Taketomi et al.

(10) Patent No.: US 12,243,739 B2
(45) Date of Patent: Mar. 4, 2025

(54) SEMICONDUCTOR WAFER AND METHOD FOR MANUFACTURING SAME

(71) Applicant: Mitsubishi Electric Corporation, Tokyo (JP)

(72) Inventors: Yuki Taketomi, Tokyo (JP); Kohei Miki, Tokyo (JP); Shinichi Miyakuni, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 371 days.

(21) Appl. No.: 17/625,084

(22) PCT Filed: Oct. 23, 2019

(86) PCT No.: PCT/JP2019/041534
§ 371 (c)(1),
(2) Date: Jan. 5, 2022

(87) PCT Pub. No.: WO2021/079434
PCT Pub. Date: Apr. 29, 2021

(65) Prior Publication Data
US 2022/0290327 A1    Sep. 15, 2022

(51) Int. Cl.
*C30B 29/40* (2006.01)
*C23C 16/04* (2006.01)
(Continued)

(52) U.S. Cl.
CPC ...... *H01L 21/02002* (2013.01); *C23C 16/042* (2013.01); *C23C 16/303* (2013.01);
(Continued)

(58) Field of Classification Search
CPC ... C23C 16/042; C23C 16/303; C23C 16/345; C23C 16/50; C30B 23/04; C30B 25/04; C30B 29/406
See application file for complete search history.

(56) References Cited

U.S. PATENT DOCUMENTS

| 2004/0029323 A1* | 2/2004 | Shimizu | H01L 21/823864 257/E21.345 |
| 2011/0140242 A1* | 6/2011 | Ramdani | H01L 21/0237 257/E29.166 |
| 2018/0166275 A1 | 6/2018 | Wang | |

FOREIGN PATENT DOCUMENTS

| CN | 102549729 A | 7/2012 |
| JP | H10-135140 A | 5/1998 |

(Continued)

OTHER PUBLICATIONS

[NPL-1] Chung (JP 2005-228936 A), Aug. 25, 2005 (EPO machine translation to English). (Year: 2005).*

(Continued)

*Primary Examiner* — Maria V Ewald
*Assistant Examiner* — Donald M Flores, Jr.
(74) *Attorney, Agent, or Firm* — Studebaker Brackett PLLC

(57) ABSTRACT

A method for manufacturing a semiconductor wafer according to the invention of the present application includes a first step of forming a gallium nitride growth layer which is divided into a plurality of small sections, on an upper surface of a silicon substrate and a second step of filling portions between the plurality of small sections with an insulating film, wherein the insulating film exerts stress to the silicon substrate in a direction opposite to a direction in which the gallium nitride growth layer exerts stress on the silicon substrate.

9 Claims, 6 Drawing Sheets

(51) Int. Cl.
  *C23C 16/30*    (2006.01)
  *C23C 16/34*    (2006.01)
  *C23C 16/50*    (2006.01)
  *C30B 23/04*    (2006.01)
  *C30B 25/04*    (2006.01)
  *H01L 21/02*    (2006.01)

(52) U.S. Cl.
  CPC .......... *C23C 16/345* (2013.01); *C23C 16/50* (2013.01); *C30B 23/04* (2013.01); *C30B 25/04* (2013.01); *C30B 29/406* (2013.01); *H01L 21/02381* (2013.01); *H01L 21/02433* (2013.01); *H01L 21/0254* (2013.01); *H01L 21/02639* (2013.01); *H01L 21/02664* (2013.01)

(56) References Cited

FOREIGN PATENT DOCUMENTS

| JP | H11-243056 A |   | 9/1999 |
|----|--------------|---|--------|
| JP | 2005228936 A | * | 8/2005 |
| JP | 2007-049180 A |   | 2/2007 |
| JP | 2011124335 A | * | 6/2011 |
| JP | 2018-520502 A |   | 7/2018 |

OTHER PUBLICATIONS

[NPL-2] Komoguchi (JP 2011-124335 A), Jun. 23, 2011 (EPO machine translation to English). (Year: 2011).*
An Office Action issued by the German Patent and Trademark Office on Dec. 13, 2022, which corresponds to German Patent Application No. 112019007835.6 and is related to U.S. Appl. No. 17/625,084; with English language translation.
International Search Report issued in PCT/JP2019/041534; mailed Jan. 21, 2020.
An Office Action; "Notice of Reasons for Refusal," mailed by the Japanese Patent Office on Jun. 16, 2020, which corresponds to Japanese Patent Application No. 2020-513664; with partial English language translation.
An Office Action issued by Taiwanese Patent Office on May 20, 2021, which corresponds to Taiwanese Patent Application No. 109135486; with partial English language translation.
An Office Action mailed by China National Intellectual Property Administration on Aug. 21, 2024, which corresponds to Chinese Patent Application No. 201980101276.X and is related to U.S. Appl. No. 17/625,084; with English language translation.

* cited by examiner

SEMICONDUCTOR WAFER AND METHOD FOR MANUFACTURING SAME

FIELD

The present invention relates to a semiconductor wafer and a method for manufacturing the same.

BACKGROUND

PTL 1 discloses a method for growing a semiconductor layer having a lattice constant different from a lattice constant of a substrate on the substrate which is sapphire or silicon carbide. In this method, a layer having openings for selectively growing a semiconductor layer at predetermined portions on the substrate is formed, and the predetermined portions of the substrate are exposed through the openings. Then, a semiconductor layer is selectively hetero-epitaxially grown on a surface of the substrate exposed through the openings.

CITATION LIST

Patent Literature

[PTL 1] JP 10-135140 A

SUMMARY

Technical Problem

If gallium nitride is grown on a silicon substrate, there is a case where the substrate may be warped due to a difference in a lattice constant between the silicon substrate and gallium nitride. The method in PTL 1 can reduce warpage of the substrate by dividing a semiconductor layer. However, with the method in PTL 1, there is a possibility that warpage cannot be sufficiently reduced. This may make a subsequent process such as an exposure process difficult.

The present invention has been made to solve the problem described above, and an object of the present invention is to provide a semiconductor wafer which can reduce warpage of a substrate, and a method for manufacturing the semiconductor wafer.

Solution to Problem

A method for manufacturing a semiconductor wafer according to the invention of the present application includes a first step of forming a gallium nitride growth layer which is divided into a plurality of small sections, on an upper surface of a silicon substrate and a second step of filling portions between the plurality of small sections with an insulating film, wherein the insulating film exerts stress to the silicon substrate in a direction opposite to a direction in which the gallium nitride growth layer exerts stress on the silicon substrate.

A semiconductor wafer according to the invention of the present application includes a silicon substrate, a gallium nitride growth layer provided on an upper surface of the silicon substrate and divided into a plurality of small sections and an insulating layer provided on the upper surface of the silicon substrate, the insulating layer filling portions between the plurality of small sections, wherein the insulating layer exerts stress to the silicon substrate in a direction opposite to a direction in which the gallium nitride growth layer exerts stress on the silicon substrate.

Advantageous Effects of Invention

A method for manufacturing a semiconductor wafer according to the invention of the present application can reduce warpage of a silicon substrate by an insulating film.

In a semiconductor wafer according to the invention of the present application, warpage of a silicon substrate can be reduced by an insulating layer.

DESCRIPTION OF EMBODIMENTS

Figure 1:
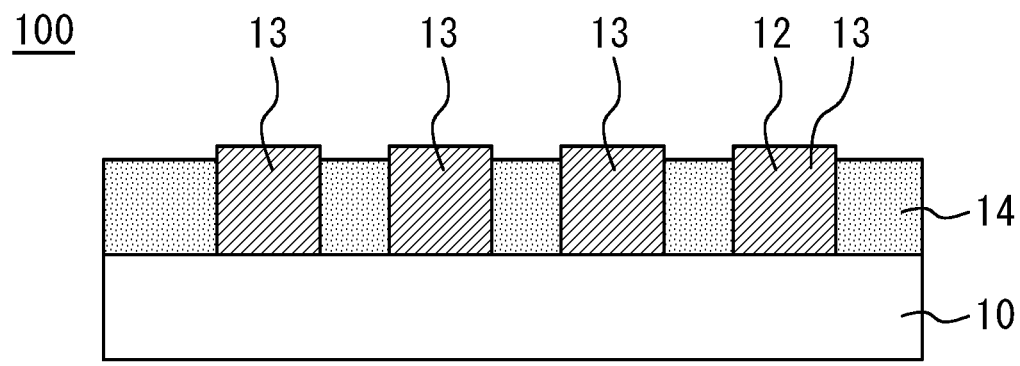
FIG. 1 is a cross-sectional view of a semiconductor wafer according to a first embodiment.

Semiconductor wafers and methods for manufacturing the same according to embodiments of the present invention are described with reference to drawings. Identical or corresponding constitutional elements are given the same reference numerals, and the repeated description of such constitutional elements may be omitted.

First Embodiment

FIG. 1 is a cross-sectional view of a semiconductor wafer 100 according to a first embodiment. The semiconductor wafer 100 includes a silicon substrate 10. A gallium nitride growth layer 12 is provided on an upper surface of the silicon substrate 10. The gallium nitride growth layer 12 is divided into a plurality of small sections 13. The plurality of small sections 13 are separate from one another. The gallium nitride growth layer is, for example, a multi-layer including $In_{1-x-y}Ga_xAl_yN$ layer. Here, $0 \leq x \leq 1$ and $0 \leq y \leq 1$.

An insulating film 14 is provided on the upper surface of the silicon substrate 10. With the insulating film 14, portions between the plurality of small sections 13 are filled. A thickness of the insulating film 14 is, for example, equal to or greater than 1 µm and equal to or less than a thickness of the gallium nitride growth layer 12. The insulating film 14 is, for example, a silicon nitride film. The insulating film 14 continues from one and to the other end of the silicon substrate 10.

Figure 2:
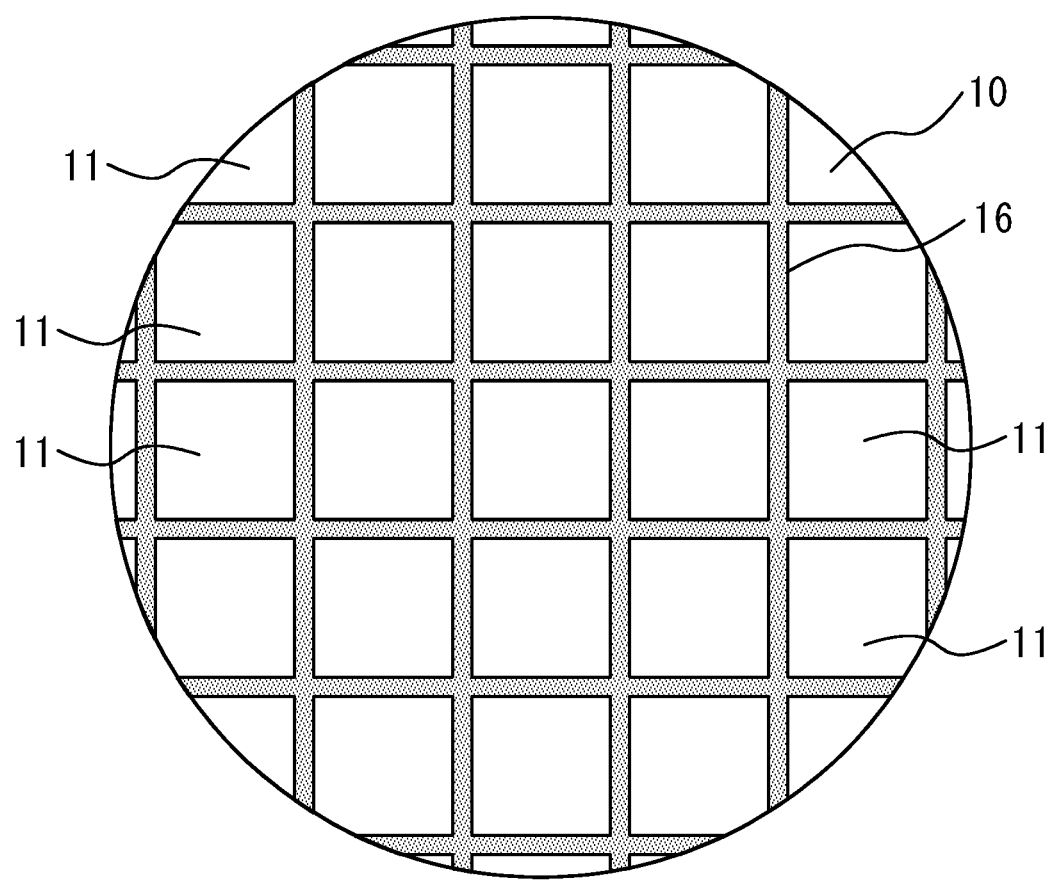
FIG. 2 is a plan view illustrating a state where the thermal oxide film is formed on the silicon substrate.

A method for manufacturing the semiconductor wafer 100 will be described next. First, a thermal oxide film 16 is formed on the upper surface of the silicon substrate 10. FIG. 2 is a plan view illustrating a state where the thermal oxide film 16 is formed on the silicon substrate 10. A grid pattern is formed on the thermal oxide film 16 through photolithography. By this means, a grid-like oxide film is formed. The upper surface of the silicon substrate 10 is separated into a plurality of regions 11 by the thermal oxide film 16.

Then, the gallium nitride growth layer 12 is formed on the silicon substrate 10. The gallium nitride growth layer 12 is formed through, for example, metal-organic chemical vapor deposition or molecular beam epitaxy. By this means, the gallium nitride growth layer 12 is formed at portions which are not covered by the thermal oxide film 16 among the silicon substrate 10. In other words, the plurality of small sections 13 are grown in the plurality of regions 11. Note that it is assumed that the gallium nitride growth layer 12 includes a buffer layer for epitaxially growing gallium nitride.

Figure 3:
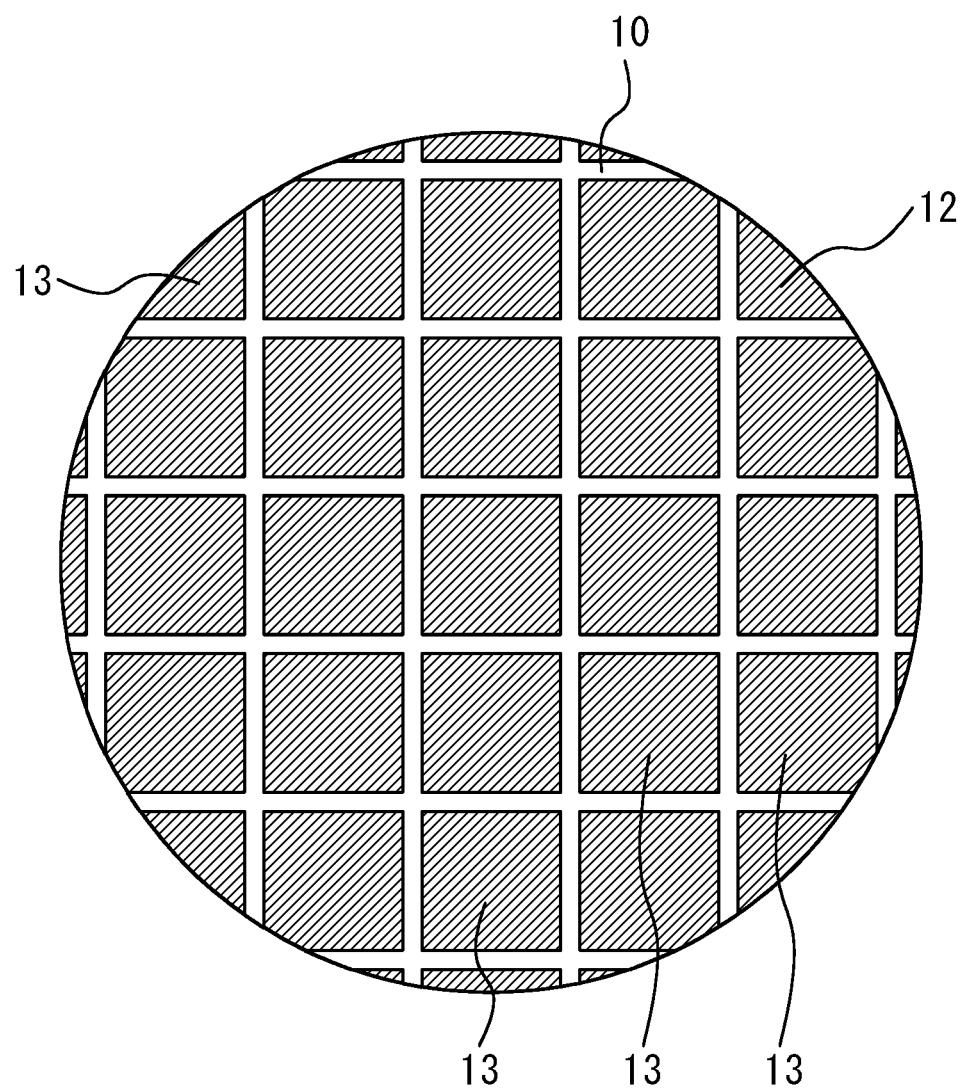
FIG. 3 is a plan view illustrating a state where the thermal oxide film is removed.
Figure 4:
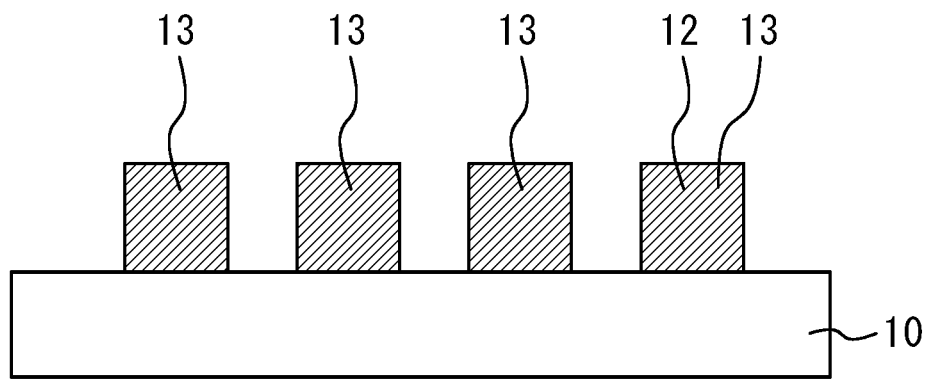
FIG. 4 is a cross-sectional view illustrating a state where the thermal oxide film is removed.

Thereafter, the thermal oxide film 16 is removed. The thermal oxide film 16 is removed using, for example, hydrofluoric acid. FIG. 3 is a plan view illustrating a state where the thermal oxide film 16 is removed. FIG. 4 is a cross-sectional view illustrating a state where the thermal oxide film 16 is removed. The above-described process of forming the gallium nitride growth layer 12, which is divided into the plurality of small sections 13, on the upper surface of the silicon substrate 10 is a first process.

Figure 5:
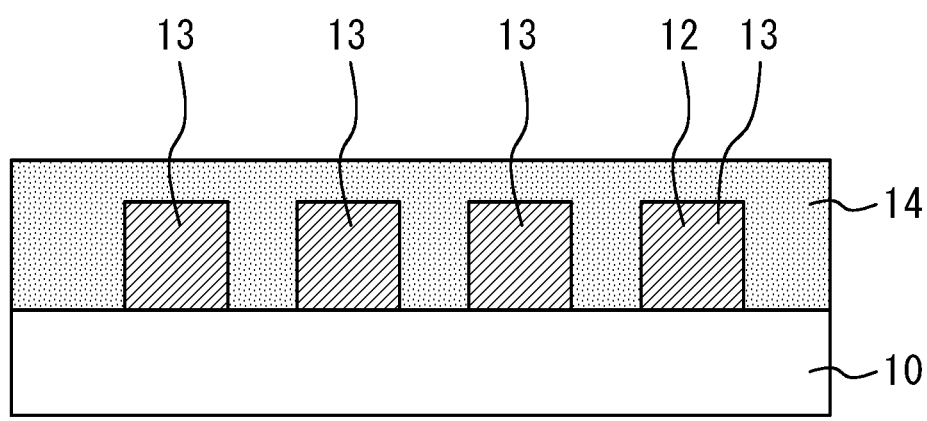
FIG. 5 is a cross-sectional view illustrating a state where the insulating film is formed.

Then, a second process of filling portions between the plurality of small sections 13 with the insulating film 14 is performed. FIG. 5 is a cross-sectional view illustrating a state where the insulating film 14 is formed. The insulating film 14 is deposited on the silicon substrate 10 through, for example, chemical vapor deposition (CVD). The insulating film 14 is formed so as to tightly adhere to the silicon substrate 10.

The insulating film 14 exerts stress on the silicon substrate 10 in a direction opposite to a direction in which the gallium nitride growth layer 12 exerts stress on the silicon substrate 10. The insulating film 14 is formed with a material which applies stress opposite to stress of the gallium nitride growth layer 12, to the silicon substrate 10. The insulating film 14 is, for example, a silicon nitride film or a silicon oxide film. The insulating film 14 is preferably formed with a material which applies great stress to the silicon substrate 10.

Typically, the silicon nitride film can generate tensile stress or compressive stress of approximately several GPa in accordance with deposition conditions. While film stress depends on a manufacturing device, the silicon nitride film formed through plasma CVD can provide film stress of approximately 300 MPa, and the silicon nitride film formed through thermal CVD can provide film stress of approximately 1 GPa. Further, the insulating film 14 may be formed through electron cyclotron resonance (ECR) sputtering. The silicon nitride film formed through ECR sputtering can provide film stress of approximately 3 GPa.

The insulating film 14 may be formed through plasma CVD using, for example, $SiH_4$ and $NH_3$ as a process gas. In this case, by changing a ratio of $SiH_4$ with respect to $NH_3$ between 0.5 and 2, film stress can be changed between tensile stress of approximately 100 MPa and compressive stress of approximately 300 MPa. Thus, for example, by setting the ratio of $SiH_4$ with respect to $NH_3$ at equal to or less than 0.5, tensile stress can be applied from the insulating film 14 to the silicon substrate 10. Further, by setting the ratio of $SiH_4$ with respect to $NH_3$ at equal to or greater than 2, tensile stress can be applied from the insulating film 14 to the silicon substrate 10.

Then, as illustrated in FIG. 1, the insulating film 14 is removed until the gallium nitride growth layer 12 is exposed. The insulating film 14 is removed through etching such as dry etching. In this event, a thickness of the insulating film 14 is adjusted by adjusting an etching period. Typically, as the insulating film 14 is thicker, stress to be exerted on the silicon substrate 10 becomes greater. Thus, by adjusting the etching period, a level of stress to be applied by the insulating film 14 to the silicon substrate 10 can be adjusted.

Further, warpage which can be corrected becomes greater in proportion to the thickness of the insulating film 14. The thickness of the insulating film 14 may be determined from an amount of warpage of the silicon substrate 10 in a state where the gallium nitride growth layer 12 is formed and before the insulating film 14 is formed. The thickness of the insulating film 14 may be set so that the silicon substrate 10 becomes flat in a state where the insulating film 14 is formed.

Typically, the film thickness of the insulating film, which is required to reduce warpage of the substrate, depends on a size of a region between the gallium nitride growth layers or film stress of the insulating film. For example, if the insulating film 14 having film stress of 1 GPa is deposited to have a thickness of 1 μm, warpage of the silicon substrate 10 of approximately several micrometers to 10 μm can be corrected compared to a case where the insulating film 14 is not provided. Here, a width of the insulating film 14 put between adjacent small sections 13 is set at 1/10 with respect to the width of the small section 13. Further, the thickness of the silicon substrate 10 is set at 625 μm. From the above-described settings, it is possible to sufficiently reduce warpage of the silicon substrate 10 by setting the thickness of the insulating film 14 at, for example, equal to or greater than 1 μm.

Through the above-described process, the insulating film 14 is formed. As illustrated in FIG. 3, the insulating film 14 is formed at portions where the gallium nitride growth layer 12 is removed and the silicon substrate 10 is exposed in a grid shape. In other words, the insulating film 14 is formed in a grid shape.

An electrode, or the like, is formed on a surface of the gallium nitride growth layer 12 exposed from the insulating film 14. A device is thereby formed.

Typically, a heterostructure can be manufactured by using a nitride-based semiconductor material such as gallium nitride (GaN), aluminum gallium nitride (AlGaN) and aluminum nitride (AlN). Thus, these materials are sometimes utilized to create a high-frequency device, an optical device or a power device.

A nitride-based semiconductor structure is typically manufactured through epitaxial growth on silicon carbide, sapphire or a silicon substrate. In particular, a silicon substrate is inexpensive compared to silicon carbide, or the like. It is therefore possible to reduce material cost.

Here, typically, there is a case where a substrate is warped if the gallium nitride is grown on the silicon substrate. This may lead to occurrence of a problem in a process of conveyance, exposure, or the like.

A lattice constant of silicon is 0.5431 nm. Thus, an interatomic spacing on a (111) plane of silicon is $0.5431/\sqrt{2}=0.3840$ nm. In contrast, a lattice constant of gallium nitride is 0.3819 nm. A lattice spacing of gallium nitride is narrower than a lattice spacing of silicon. Thus, the silicon substrate receives compressive stress from gallium nitride which is epitaxially grown on the (111) plane.

Further, a linear expansion coefficient of silicon is $2.6 \times 10^{-6}$ $K^{-1}$. In contrast, a linear expansion coefficient of gallium nitride is $5.6 \times 10^{-6}$ $K^{-1}$. Normally, gallium nitride is grown at a high temperature of equal to or higher than 800° C. Thus, when the temperature falls from a growth temperature to a room temperature, gallium nitride contracts more than silicon. Thus, the silicon substrate receives compressive stress from the gallium nitride growth layer.

Accordingly, if the gallium nitride growth layer is formed on the silicon substrate, the silicon substrate is warped so that the gallium nitride growth layer is on an inside. Actually, a direction of warpage differs depending on conditions of epitaxial growth or a configuration of the buffer layer.

Further, it is also possible to reduce warpage of the substrate by dividing the gallium nitride growth layer into small sections to disperse stress. However, typically, it is difficult to completely eliminate warpage of the substrate with such a method. For example, there is a possibility that wafer warpage of approximately several micrometers to 10 μm may be left on a substrate of 4 inches. Such warpage particularly becomes a problem in a gate exposure process, or the like, in which it is necessary to form a fine pattern.

In contrast, the insulating film 14 in the present embodiment exerts stress on the silicon substrate 10 in a direction opposite to a direction in which the gallium nitride growth layer 12 exerts stress on the silicon substrate 10. In other words, in a case where the gallium nitride growth layer 12 exerts compressive stress on the silicon substrate 10, a material which exerts tensile stress on the silicon substrate is used as the insulating film 14. Further, in a case where the gallium nitride growth layer 12 exerts tensile stress on the silicon substrate 10, a material which exerts compressive stress on the silicon substrate is used as the insulating film 14.

By this means, stress received by the silicon substrate 10 from the gallium nitride growth layer 12 can be cancelled out by the insulating film 14. It is therefore possible to reduce warpage of the silicon substrate 10. In the present embodiment, both an effect of dispersing stress by dividing the gallium nitride growth layer 12 into small sections 13 and an effect of cancelling out stress by the insulating film 14 can be obtained. It is therefore possible to easily implement an exposure process while reducing warpage of wafer.

Further, stress to be exerted on the silicon substrate 10 can be adjusted by the thickness of the insulating film 14. The thickness of the insulating film 14 can be adjusted by an etching period. It is therefore possible to easily make the silicon substrate 10 flat.

Note that it is difficult to reduce warpage by forming a thick thermal oxide film 16 illustrated in FIG. 2. In this case, a thick thermal oxide film 16 is formed on the silicon substrate 10 before epitaxial growth. In this event, the thermal oxide film 16 has great film stress, and thus, there is a possibility that wafer is greatly warped when epitaxial growth starts. This may make an epitaxial growth process difficult.

It is therefore necessary to form a thin thermal oxide film 16 to prevent the silicon substrate 10 from being greatly warped. In contrast, the insulating film 14 is formed to have a thickness greater than a thickness of the thermal oxide film 16 so as to apply greater stress to the silicon substrate 10.

As a modified example of the present embodiment, a shape of a region where the gallium nitride growth layer 12 is removed illustrated in FIG. 3 is not limited to a grid shape. The region where the gallium nitride growth layer 12 is removed may have other shapes if the gallium nitride growth layer 12 can be divided into a plurality of small sections 13. The region where the gallium nitride growth layer 12 is removed preferably vertically and horizontally continues from one end to the other end of the silicon substrate 10 considering that the insulating film 14 is formed to apply stress to the silicon substrate 10.

Further, the first process may be performed as follows. First, the gallium nitride growth layer 12 is formed on the whole upper surface of the silicon substrate 10 through metal-organic chemical vapor deposition or molecular beam epitaxy. Then, a mask layer such as photoresist is formed on the gallium nitride growth layer 12. Then, the gallium nitride growth layer 12 is etched using the mask layer until the silicon substrate 10 is exposed. As a result of this, the silicon substrate 10 is exposed in a grid shape, and the gallium nitride growth layer 12 is divided into a plurality of small sections 13. Then, the mask layer is removed.

These modifications can be applied, as appropriate, to semiconductor wafers and methods for manufacturing the same according to the following embodiments. Note that the semiconductor wafers and the methods for manufacturing the same according to the following embodiments are similar to those of the first embodiment in many respects, and thus differences between the semiconductor wafers and the methods for manufacturing the same according to the following embodiments and those of the first embodiment will be mainly described below.

Second Embodiment

Figure 6:
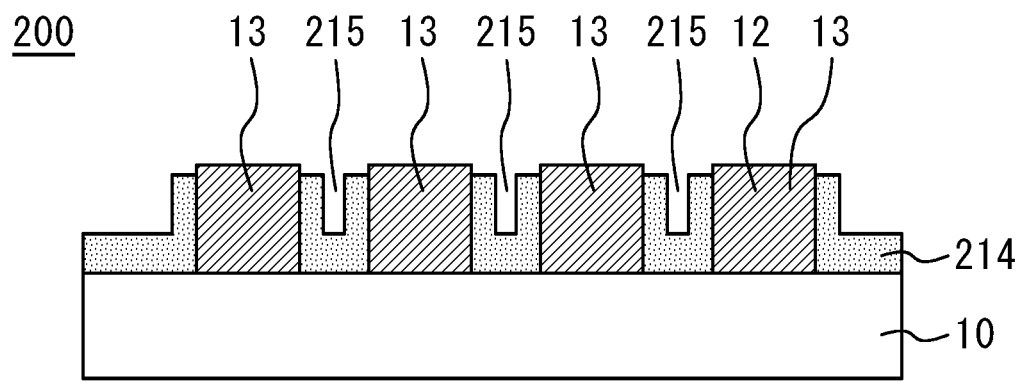
FIG. 6 is a cross-sectional view of a semiconductor wafer according to a second embodiment.

FIG. 6 is a cross-sectional view of a semiconductor wafer 200 according to a second embodiment. A structure of an insulating film 214 in the semiconductor wafer 200 is different from the structure of the insulating film in the semiconductor wafer 100. Concave portions 215 are formed between pairs of small sections 13 adjacent to each other among the plurality of small sections 13 in the insulating film 214.

Figure 7:
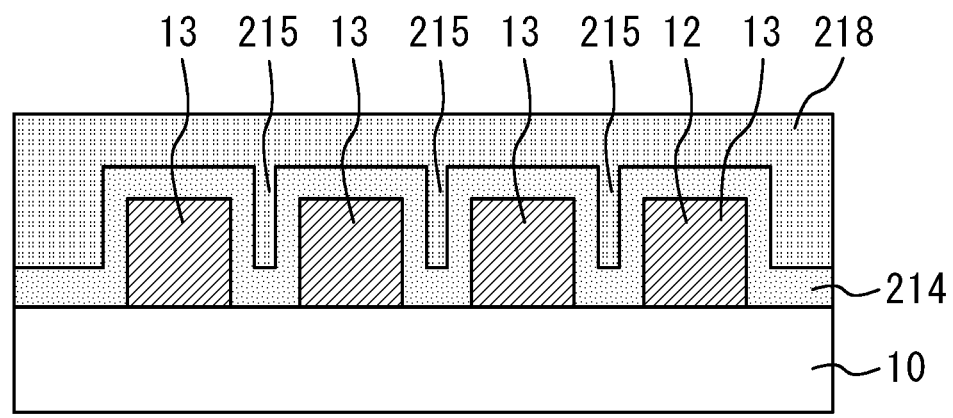
FIG. 7 is a cross-sectional view describing the method for manufacturing the semiconductor wafer according to the second embodiment.

A method for manufacturing the semiconductor wafer 200 will be described next. The first process is the same as the first process in the first embodiment. The second process will be described next. FIG. 7 is a cross-sectional view describing the method for manufacturing the semiconductor wafer according to the second embodiment. First, an upper surface of the silicon substrate 10 and a side surface and an upper surface of each of the plurality of small sections 13 are covered with the insulating film 214.

The insulating film 214 is formed along the silicon substrate 10 and the plurality of small sections 13. Concavities and convexities reflecting the shape of the plurality of small sections 13 are formed on a surface of the insulating film 214. In this event, concave portions 215 are formed at portions between pairs of small sections 13 adjacent to each other in the insulating film 214. A thickness of portions which cover side surfaces of the small sections 13 in the insulating film 214 is equal to or less than ½ of a width of a region put between the adjacent small sections 13.

Then, resist 218 is applied. The resist 218 is provided on the insulating film 214 so that the concave portions 215 are filled with the resist 218. An upper surface of the resist 218 is flat. The resist 218 has such a thickness that concavities and convexities on the surface of the insulating film 214 are not reflected on the upper surface of the resist 218.

Figure 8:
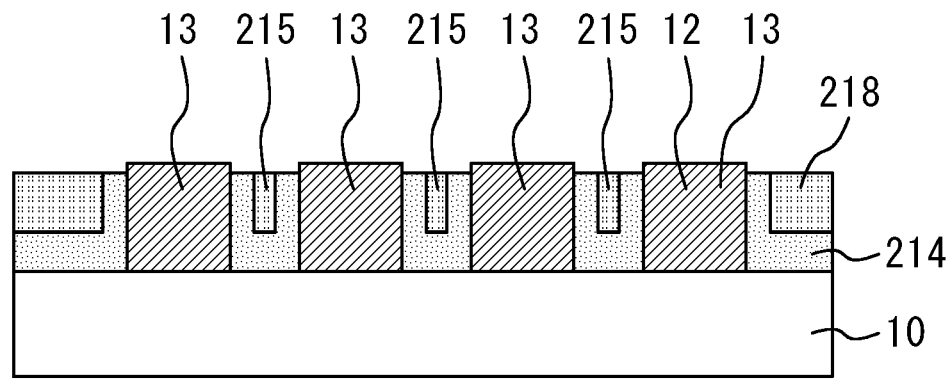
FIG. 8 is a cross-sectional view illustrating a state where the upper surfaces of the plurality of small sections are exposed.

Then, an etching process is performed. By this means, upper surfaces of the plurality of small sections 13 are exposed from the insulating film 214. FIG. 8 is a cross-sectional view illustrating a state where the upper surfaces of the plurality of small sections 13 are exposed. In the etching process, the resist 218 is also removed along with the insulating film 214 through dry etching until the gallium nitride growth layer 12 is exposed. As a result of this, portions of the resist 218 provided above the upper surfaces of the plurality of small sections 13 and portions of the insulating film 214 provided above the upper surfaces of the plurality of small sections 13 are removed.

In this event, it is preferable to use etching conditions which make an etching rate of the resist 218 equal to an etching rate of the insulating film 214. Typically, it is possible to find etching conditions which make the etching rate of the resist equal to the etching rate of the insulating film in a silicon oxide film and a silicon nitride film. Such etching conditions can expose the upper surfaces of the plurality of small sections 13 with high accuracy.

After the etching process, potions of the resist 218, with which the concave portions 215 are filled are removed. Through the above-described process, the insulating film 214 is formed.

If the insulating film 214 is provided so as to cover the plurality of small sections 13, as illustrated in FIG. 7, there is a case where grid-like concavities and convexities may be formed on the surface of the insulating film 214. If only the insulating film 214 is etched until the gallium nitride growth layer 12 is exposed, similar to the first embodiment, without the resist 218 being applied, the insulating film 214 on the silicon substrate 10 is also etched. Thus, there is a possibility that the insulating film 214 is scarcely left on the silicon substrate 10.

In an extreme case where a film having coverage of 0 is used as the insulating film 214, the insulating film 214 has the same thickness on the gallium nitride growth layer 12 and on the silicon substrate 10. Thus, if the insulating film 214 is etched until the gallium nitride growth layer 12 is exposed, the insulating film 214 on the silicon substrate 10 is also completely removed.

In contrast, in the present embodiment, a thick insulating film 214 can be left on the silicon substrate 10 also in a case where concavities and convexities are formed on the surface of the insulating film 214. It is therefore possible to sufficiently reduce warpage of the silicon substrate 10 by the insulating film 214.

Third Embodiment

Figure 9:
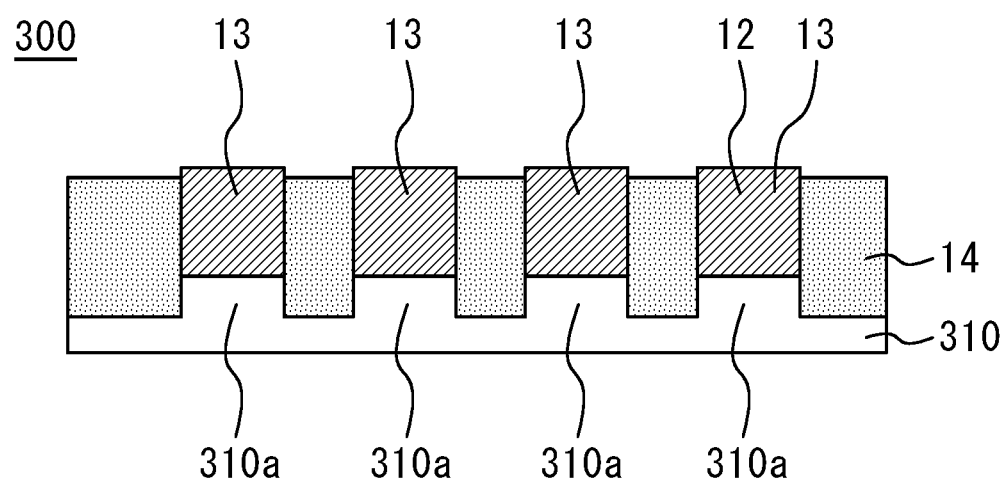
FIG. 9 is a cross-sectional view of a semiconductor wafer according to a third embodiment.

FIG. 9 is a cross-sectional view of a semiconductor wafer 300 according to a third embodiment. The semiconductor wafer 300 is different from the semiconductor wafer 100 in a structure of a silicon substrate 310. A plurality of convex portions 310a are formed on a side of an upper surface of the silicon substrate 310. The plurality of small sections 13 are provided on the plurality of convex portions 310a.

A method for manufacturing the semiconductor wafer 300 will be described next. First, the gallium nitride growth layer 12 is formed on the upper surface of the silicon substrate 310. In this state, the upper surface of the silicon substrate 310 is flat. Further, the gallium nitride growth layer 12 is formed on the whole upper surface of the silicon substrate 310.

Then, an etching process is performed. In the etching process, first, a mask layer such as photoresist is formed on the gallium nitride growth layer 12. Then, part of the gallium nitride growth layer 12 is removed using the mask layer through etching. The etching is, for example, dry etching. By this means, the gallium nitride growth layer 12 is removed in a grid shape, and the silicon substrate 310 is exposed. The gallium nitride growth layer 12 is divided into a plurality of small sections 13 through the etching process.

Further, etching is continued also after the silicon substrate 310 is exposed. As a result of this, the silicon substrate 310 is etched, and grooves are formed on the silicon substrate 310. In other words, a plurality of convex portions 310a are formed on the side of the upper surface of the silicon substrate 310.

Then, the insulating film 14 is formed. With the insulating film 14, portions between adjacent convex portions 310a are filled. The subsequent process is similar to the process in the first embodiment.

In the present embodiment, it is possible to make the insulating film 14 thicker by an amount corresponding to a depth of the grooves formed on the silicon substrate 310. It is therefore possible to apply stress greater than stress in the first embodiment to the silicon substrate 310 by the insulating film 14. Further, also in a case where the thickness of the gallium nitride growth layer 12 is thinner than the thickness of the insulating film 14 which is required to reduce warpage, the insulating film 14 can be made thick.

Fourth Embodiment

Figure 10:
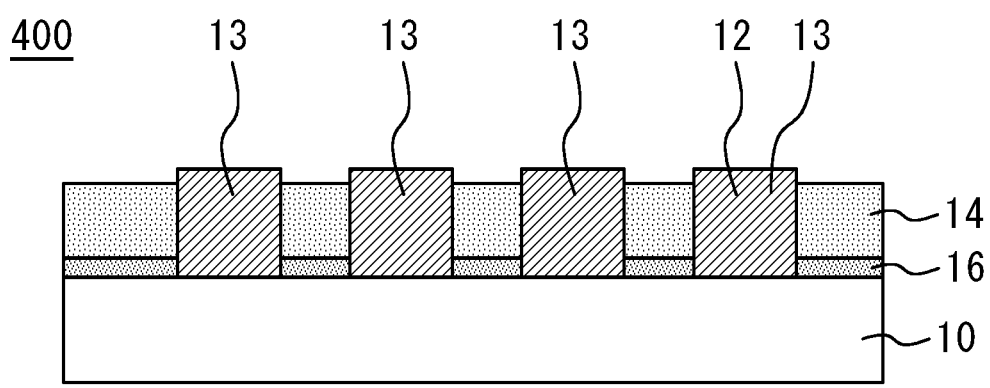
FIG. 10 is a cross-sectional view of a semiconductor wafer according to a fourth embodiment.

FIG. 10 is a cross-sectional view of a semiconductor wafer 400 according to a fourth embodiment. In the present embodiment, the thermal oxide film 16 is provided on the upper surface of the silicon substrate 10. The insulating film 14 is provided on the thermal oxide film 16. The thermal oxide film 16 and the insulating film 14 form an insulating layer.

A method for manufacturing the semiconductor wafer 400 will be described next. Processes until the process of growing the gallium nitride growth layer 12 is similar to those in the first embodiment. In the present embodiment, the thermal oxide film 16 is not removed. Then, the insulating film 14 is formed on the thermal oxide film 16. The subsequent processes are similar to those in the first embodiment.

In the present embodiment, the thermal oxide film 16 is not removed, so that it is possible to simplify the manufacturing process. Further, in a case where the thermal oxide film 16 exerts stress which corrects warpage of the silicon substrate 10, the thermal oxide film 16 can be effectively utilized to reduce warpage.

Note that the technical features described in the above embodiments may be combined as appropriate.

REFERENCE SIGNS LIST 10 silicon substrate, 11 region, 12 gallium nitride growth layer, 13 small section, 14 insulating film, 16 thermal oxide film, 100, 200 semiconductor wafer, 214 insulating film, 215 concave portion, 218 resist, 300 semiconductor wafer, 310 silicon substrate, 310a convex portion, 400 semiconductor wafer

The invention claimed is:
1. A semiconductor wafer comprising:
a silicon substrate;
a gallium nitride growth layer provided on an upper surface of the silicon substrate and divided into a plurality of small sections; and
an insulating layer provided on the upper surface of the silicon substrate, the insulating layer filling portions between the plurality of small sections, wherein the insulating layer exerts stress to the silicon substrate in a direction opposite to a direction in which the gallium nitride growth layer exerts stress on the silicon substrate, the insulating layer includes a silicon nitride film, a plurality of convex silicon portions are formed on a side of the upper surface of the silicon substrate, and the plurality of small sections are provided on the plurality of convex silicon portions.

2. The semiconductor wafer according to claim 1, wherein a thickness of the insulating layer is equal to or greater than 1 μm and equal to or less than a thickness of the gallium nitride growth layer.

3. The semiconductor wafer according to claim 1, wherein concave portions in the insulating layer are formed between pairs of small sections adjacent to each other among the plurality of small sections.

4. The semiconductor wafer according to claim 1, wherein the insulating layer continues from one end to the other end of the silicon substrate.

5. A semiconductor wafer comprising:

a silicon substrate;

a gallium nitride growth layer provided on an upper surface of the silicon substrate and divided into a plurality of small sections; and an insulating layer provided on the upper surface of the silicon substrate, the insulating layer filling portions between the plurality of small sections, wherein the insulating layer exerts stress to the silicon substrate in a direction opposite to a direction in which the gallium nitride growth layer exerts stress on the silicon substrate, the insulating layer includes a silicon nitride film, and concave portions are formed in the insulating layer between pairs of small sections adjacent to each other among the plurality of small sections.

6. The semiconductor wafer according to claim 5, wherein a thickness of the insulating layer is equal to or greater than 1 μm and equal to or less than a thickness of the gallium nitride growth layer.

7. The semiconductor wafer according to claim 5, wherein the insulating layer includes a thermal oxide film provided on the upper surface of the silicon substrate and the silicon nitride film provided on the thermal oxide film.

8. The semiconductor wafer according to claim 7, wherein the silicon nitride film is thicker than the thermal oxide film.

9. The semiconductor wafer according to claim 5, wherein the insulating layer continues from one end to the other end of the silicon substrate.

* * * * *